(12) United States Patent
DuBose et al.

(10) Patent No.: US 11,050,394 B2
(45) Date of Patent: Jun. 29, 2021

(54) MODULES, MULTI-STAGE SYSTEMS, AND RELATED METHODS FOR RADIO FREQUENCY POWER AMPLIFIERS

(71) Applicant: Tokyo Electron Limited, Tokyo (JP)

(72) Inventors: Chelsea DuBose, Austin, TX (US); Merritt Funk, Austin, TX (US); Justin Moses, Austin, TX (US); Kazuki Moyama, Kurokawa-gun (JP); Kazushi Kaneko, Kurokawa-gun (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 112 days.

(21) Appl. No.: 16/441,517

(22) Filed: Jun. 14, 2019

(65) Prior Publication Data
US 2020/0395901 A1 Dec. 17, 2020

(51) Int. Cl.
| | |
|---|---|
| *H03F 1/00* | (2006.01) |
| *H03F 3/24* | (2006.01) |
| *H05K 7/20* | (2006.01) |
| *H03F 1/30* | (2006.01) |

(52) U.S. Cl.
CPC ............. *H03F 3/24* (2013.01); *H03F 1/30* (2013.01); *H05K 7/20509* (2013.01); *H03F 2200/451* (2013.01)

(58) Field of Classification Search
CPC ........ H03F 3/68; H03F 3/195; H05K 7/20509
USPC ................. 330/65, 66, 67, 68, 295
See application file for complete search history.

(56) References Cited

U.S. PATENT DOCUMENTS

| | | | | |
|---|---|---|---|---|
| 7,755,452 | B2* | 7/2010 | Knickerbocker | H03F 3/19 333/131 |
| 9,484,284 | B1 | 11/2016 | Gambin et al. | |
| 2012/0067871 | A1* | 3/2012 | Sherrer | C23C 28/42 219/678 |
| 2014/0269856 | A1 | 9/2014 | Gianvittorio et al. | |
| 2014/0332949 | A1* | 11/2014 | Davis | B23P 15/26 257/712 |

(Continued)

FOREIGN PATENT DOCUMENTS

KR 101864803 B1 6/2018

OTHER PUBLICATIONS

International Search Report and Written Opinion, PCT Application No. PCT/US2020/027014, dated Jul. 22, 2020, 11 pages.

*Primary Examiner* — Steven J Mottola
(74) *Attorney, Agent, or Firm* — Slater Matsil, LLP

(57) ABSTRACT

Embodiments are described for modules, multi-stage systems, and related methods for radio frequency (RF) power amplifiers with reduced size and weight requirements. Fluid cooling is incorporated directly into the power amplifier (PA) module design rather than requiring PA modules to be mounted on separate cooling devices. For one embodiment, a PA module includes a circuit board, RF circuit components, a ground plane, and a cooling plate having one or more cooling channels to receive a cooling fluid. The cooling channels are positioned to dissipate heat from the RF circuit components through the ground plane. For a further embodiment, the PA module also includes RF bias and power electronics within a housing for the PA module without requiring an external control board or power conversion electronics. Also disclosed are multi-stage PA systems having a plurality of PA modules that are similarly cooled using cooling channels.

24 Claims, 5 Drawing Sheets

(56) References Cited

U.S. PATENT DOCUMENTS

2016/0359460 A1* 12/2016 Garuti .................... H03F 3/211
2018/0277339 A1    9/2018 Kaneko et al.

* cited by examiner

MODULES, MULTI-STAGE SYSTEMS, AND RELATED METHODS FOR RADIO FREQUENCY POWER AMPLIFIERS

BACKGROUND

The present disclosure relates to methods for the manufacture of microelectronic workpieces including the formation of patterned structures on microelectronic workpieces.

Device formation within microelectronic workpieces typically involves a series of manufacturing techniques related to the formation, patterning, and removal of a number of layers of material on a substrate. To meet the physical and electrical specifications of current and next generation semiconductor devices, processing flows are being requested to reduce feature size while maintaining structure integrity for various patterning processes.

Plasma processing systems are used to perform etch, deposition, and other processes for the manufacture of microelectronic workpieces. Plasma processing systems include power generation systems that generate radio frequency (RF) energy, such as microwave energy. This RF energy is used in part to ignite and maintain plasma within a process chamber that includes a microelectronic workpiece being processed. Size and weight of power amplifier modules and related multi-stage systems used to generate this high-power RF energy can become difficult to manage in a processing equipment installation.

SUMMARY

Embodiments are described herein for modules, multi-stage systems, and related methods for high-power RF amplifiers with reduced size and weight requirements. Different or additional features, variations, and embodiments can also be implemented, and related systems and methods can be utilized as well.

For one embodiment, a power amplifier module is disclosed including a circuit board, radio frequency (RF) circuit components coupled to the circuit board and having an RF input signal and an amplified RF output signal, a ground plane coupled to the circuit board, and a cooling plate coupled to the ground plane and having one or more cooling channels configured to receive a cooling fluid, where the one or more cooling channels are open to a top surface of the cooling plate and are positioned to dissipate heat from one or more of the RF circuit components through the ground plane.

In additional embodiments, a maximum power level for the amplified RF output signal is greater than or equal to 300 watts, and the power amplifier module is configured to operate at frequencies between 400 kilohertz (kHz) to 101 megahertz (MHz), in a frequency band from 800 MHz to 900 MHz, or at frequencies greater than or equal to 2 gigahertz (GHz). In further embodiments, the RF circuit components have multiple amplified RF output signals.

In additional embodiments, the power amplifier module also includes one or more fins positioned within the one or more cooling channels to facilitate heat dissipation. In further embodiments, the fins extend from at least one of the ground plane or the cooling plate.

In additional embodiments, the ground plane and the cooling plate are formed as an integrated component or using a three-dimensional printing process.

In additional embodiments, the circuit board includes two or more regions made from different dielectric materials. In further embodiments, an RF combiner is coupled at a boundary between at least two of the regions. In still further embodiments, the ground plane includes copper, and the cooling plate includes aluminum.

In additional embodiments, the power amplifier module also includes electronics coupled to a bottom surface of the cooling plate below at least a portion of the one or more cooling channels, and the electronics include at least one of power conversion circuitry or RF bias circuitry. In further embodiments, the cooling plate and the ground plane shield the electronics from interference without additional RF shielding components. In still further embodiments, the power amplifier module also includes one or more filtered feed ports passing through the ground plane and the cooling plate and coupled between the electronics and the RF circuit components.

In additional embodiments, the ground plane, the RF circuit components, and the cooling plate are mounted within a housing. A volume for the housing is less than or equal to fifty cubic inches, and a weight for the power amplifier module is less than or equal to three pounds.

For one embodiment, a multi-stage power amplifier system is disclosed including a plurality of power amplifier (PA) modules and a combiner coupled to receive radio frequency (RF) output signals from the PA modules and to output a combined RF output signal. Each of the plurality of PA modules includes a circuit board, radio frequency (RF) circuit components coupled to the circuit board and having an RF input signal and an amplified RF output signal, a ground plane coupled to the circuit board, and a cooling plate coupled to the ground plane and having one or more cooling channels configured to receive a cooling fluid, where the one or more cooling channels are open to a top surface of the cooling plate and are positioned to dissipate heat from one or more of the RF circuit components through the ground plane.

In additional embodiments, the multi-stage power amplifier system also includes an input manifold for a fluid input and an output manifold for fluid output. The input manifold and the output manifold are coupled to the one or more cooling channels for the plurality of PA modules and are positioned within an enclosure for the multi-stage power amplifier system along with the plurality of PA modules and the combiner. In further embodiments, the multi-stage power amplifier system also includes a pre-amplifier positioned within the enclosure and coupled to the plurality of PA modules, the input manifold, and the output manifold.

In additional embodiments, the multi-stage power amplifier system also includes electronics coupled to a bottom surface of the cooling plate below at least a portion of the one or more cooling channels, and the electronics include at least one of power conversion circuitry or RF bias circuitry.

In additional embodiments, each of the PA modules has a weight less than or equal to three pounds. Each of the PA modules also includes a housing that holds the ground plane, the RF circuits components, and the cooling plate, where the housing has a volume of less than or equal to fifty cubic inches.

For one embodiment, a method to dissipate heat within a power amplifier module is disclosed including receiving an radio frequency (RF) input signal with RF circuit components coupled to a circuit board that is coupled to a ground plane, amplifying the RF input signal to output an amplified RF output signal, and flowing a cooling fluid through one or more cooling channels within a cooling plate coupled to the ground plane to dissipate heat from one or more of the RF circuit components through the ground plane, where the one or more cooling channels are open to a top surface of the cooling plate.

In additional embodiments, a maximum power level for the amplified RF output signal is greater than or equal to 300, and the power amplifier module is configured to operate at frequencies between 400 kilohertz (kHz) to 101 megahertz (MHz), in a frequency band from 800 MHz to 900 MHz, or at frequencies greater than or equal to 2 gigahertz (GHz). In further additional embodiments, the flowing of the cooling fluid also dissipates heat from electronics coupled to a bottom surface of the cooling plate below at least a portion of the one or more cooling channels.

In additional embodiments, the method also includes shielding electronics coupled to a bottom surface of the cooling plate below at least a portion of the one or more cooling channels from RF interference using the ground plane and the cooling plate, where the electronics include at least one of power conversion circuitry or RF bias circuitry. In further additional embodiments, the method also includes passing signals from electronics coupled to a bottom surface of the cooling plate to the RF circuit components through one or more filtered feed ports.

In additional embodiments, the method also includes receiving the cooling fluid from an input manifold and providing the cooling fluid to an output manifold after passing through the one or more cooling channels, where the input manifold and the output manifold are coupled a plurality of additional power amplifier modules within an enclosure for a multi-stage power amplifier system.

Different or additional features, variations, and embodiments can also be implemented, and related systems and methods can be utilized as well.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Embodiments are described herein for modules, multi-stage systems, and related methods for RF power amplifiers with reduced size and weight requirements. In part, fluid cooling is incorporated directly into the power amplifier (PA) module design rather than requiring the PA module to be mounted on a separate cooling device. For one embodiment, the PA module also includes control and power electronics within a housing for the PA module without requiring an external control board or power conversion electronics. Other advantages and implementations can also be achieved while still taking advantage of the process techniques described herein.

Figure 1:
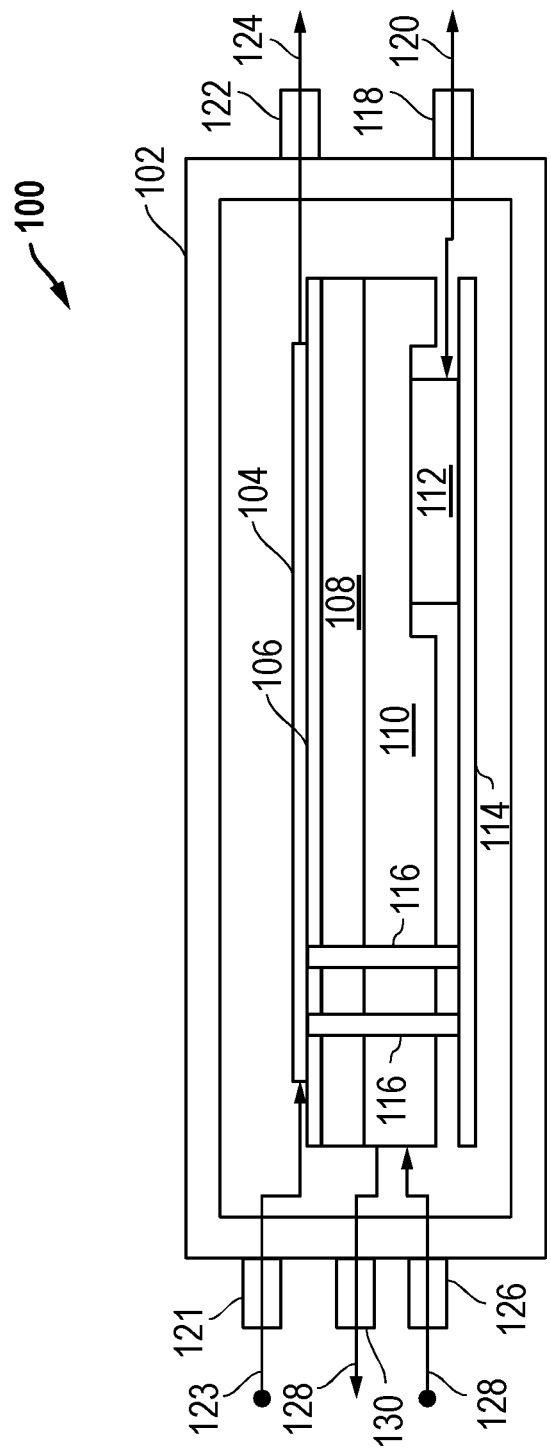
FIG. 1 is a diagram of an example embodiment for a power amplifier (PA) module including a ground plane and a cooling plate with one or more cooling channels.

FIG. 1 is a diagram of an example embodiment for a power amplifier (PA) module 100. The PA module 100 includes a housing 102. Looking first at the bottom portion of the housing 102, a circuit board 114 is mounted within the housing 102. Electronics 112, such as RF bias circuitry and power conversion circuitry, are mounted on the circuit board 114. For one embodiment, the circuit board 114 includes conductive connections or traces formed within a dielectric material, and these conductive connections or traces can be made from copper or another conductive material. The electronics 112 can include circuitry for direct current (DC) power conversion, RF bias, safety monitoring, data transmission and/or other functions for the PA module 100. For one embodiment, the electronics 112 provide DC-to-DC conversion of a 400 volt (V) DC input voltage to a 50 V voltage used within the PA module 100. The electronics 112 receive power, bias, control, and/or other signals through a port 118. It is noted that data, such as sensor data from monitoring circuits, and/or other signals can be output by the PA module 100 through port 118 as well. Although these input and output signals 120 are shown as passing through port 118, multiple ports could also be used. The electronics 112 are also coupled to a bottom surface of cooling plate 110 that receives a cooling fluid 128 as described herein. The top surface of the cooling plate 110 is mounted or otherwise coupled to a ground plane 108. As described further below, the cooling plate 110 can be aluminum and the ground plane can be copper, although other materials or combinations of materials could be used.

Further, for the example embodiment in FIG. 1, a circuit board 106 is coupled on top of the ground plane 108. RF circuit components 104 are mounted on the circuit board 106, and these RF circuit components 104 include RF distribution and power amplifier circuitry that produce an amplified RF output signal 124. An RF input signal 123 is received through a port 121. The amplified RF output signal 124 is output by the RF circuit components 104 through a port 122. Although not shown in detail, it is noted that a wide variety of electronic components can be mounted to or formed on the circuit board 106. For one embodiment, the circuit board 106 includes conductive connections or traces formed on a dielectric material, and these conductive connections or traces can be made from copper or another conductive material. Further, the RF circuit components 104 can include a wide variety of RF circuitry including quadrature splitters, power amplifier transistors, quadrature combiners, and/or other RF circuitry. Further, one or more feed ports 116 can be provided that extend from connections on the circuit board 114 to connections on the circuit board 106. For example, the feed ports 116 can be used to supply RF bias signals, monitoring control signals, and/or other signals between the circuit board 114 and the circuit board 106. It is also noted that the feed ports 116 can be filtered feed ports that provide RF filtering to reduce unwanted interference that can degrade the signals within the circuit board 114 and/or the electronics 112.

The PA module 100 can be configured to operate in a variety of frequency ranges. For example, the PA module 100 can be configured to operate at frequencies greater than or equal to 2 gigahertz (GHz), in a frequency band from 2.4 GHz to 2.5 GHz, in a 5 GHz band, in a frequency band from 800 megahertz (MHz) to 900 MHz, and/or at frequencies between 400 kilohertz (kHz) and 101 MHz. Example frequency bands in this 400 kHz to 101 MHz range include frequency bands from 99-101 MHz, from 59-61 MHz, from 26-28 MHz, and from 12-14 MHz. Other output frequencies and frequency ranges could also be used.

As described further below with respect to FIGS. 2A-2B and FIG. 3, the cooling plate 110 includes one or more cooling channels. During operation, a cooling fluid 128 passes through input port 126 and flows through the cooling channels within the cooling plate 110. After passing through the cooling channels within the cooling plate, the cooling fluid 128 exits through port 130. As described herein, the cooling plate 110 and/or other features of the PA module 100 allow for construction of reduced weight and size modules as compared to prior solutions. As such, the disclosed embodiments provide high-power PA modules 100 that are smaller and lighter than current RF solid state power amplifier (SSPA) modules.

By including cooling channels within the cooling plate 110, effective heat reduction is provided in reduced size/weight solutions. Preferably, the PA module 100 is almost entirely self-contained, requiring only RF input/output ports 121/122, DC power supply connections through port 118, analog input/output (AIO) and digital input/output (DIO) paths through port 118 or another port, and cooling fluid ports 126/130. In addition, module output power can be controlled by adjusting the RF input signal 123 and/or the amplification provided by the PA module 100. The RF input signal can be, for example, a microwave signal, and this microwave signal can be single peak, broadband, or multi-toned, and can have a continuous or pulsed power level. Further, DC-to-DC conversion circuitry can be included as part of electronics 112 within the PA module 100 to eliminate the size and weight required for a DC-to-DC conversion module external to the PA module 100, for example, that is configured to feed multiple PA modules for multi-stage implementations as shown in 5A-5B.

For one embodiment, the PA module 100 is capable of providing a RF output signal 124 having a maximum power level that is greater than or equal to 300 watts (W), and the power amplifier module is configured to operate at frequencies between 400 kilohertz (kHz) to 101 megahertz (MHz), in a frequency band from 800 MHz to 900 MHz, or at frequencies greater than or equal to 2 gigahertz (GHz). For a further embodiment, the RF output signal 124 can be controlled from zero (0) W to a maximum power for the PA module 100. For one embodiment, the maximum power is at least 600 W to 700 W. Further, for one embodiment, the PA module 100 weighs less than three (3) pounds and has a volume that is less than 50 cubic inches. For example, the PA module 100 can weigh 2.2 pounds and be 6.2 inches long, 3.8 inches wide, and 1.7 inches high. The compact design for the PA module 100 also requires fewer connections than prior solutions, improved RF shielding for internal electronics, reduced flowrates for cooling fluids, as well as other advantages. For example, the cooling plate 110 and the ground plane 108 can provide RF shielding of the electronics 112, removing the need for additional shielding.

Figure 2A:
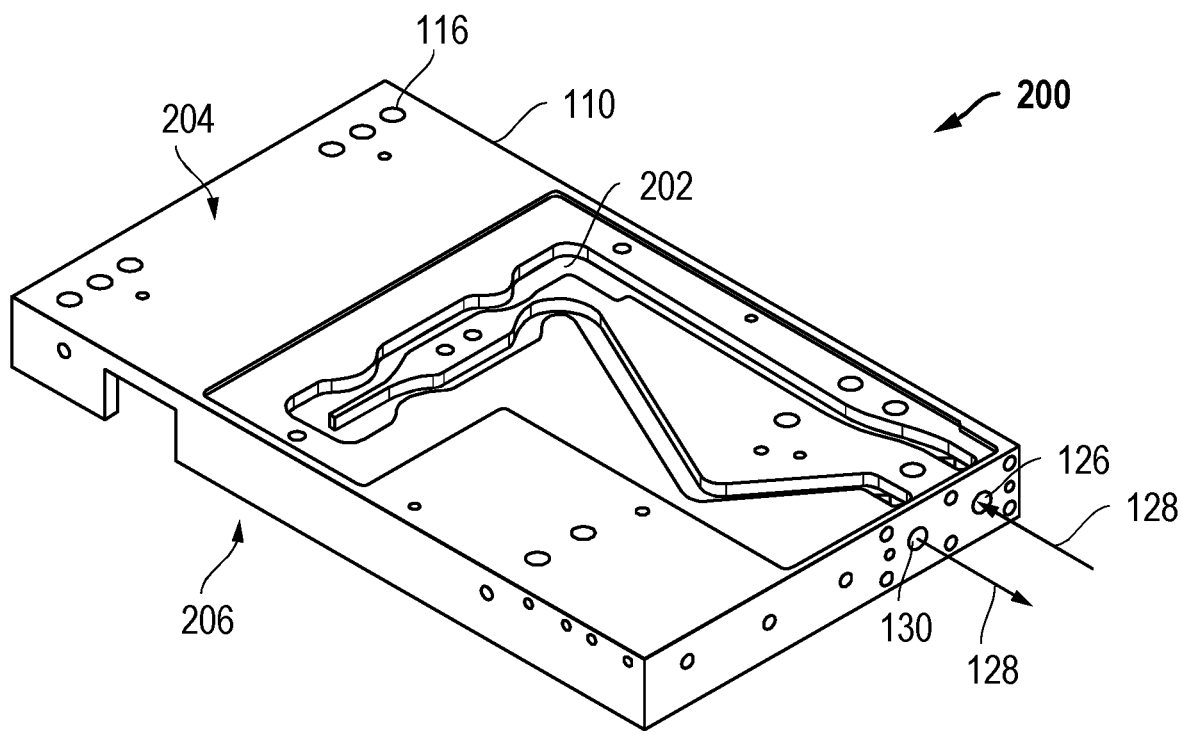
FIG. 2A is a top perspective view of an example embodiment for the cooling plate in FIG. 1 having one or more cooling channels.

FIG. 2A is a top perspective view 200 of an example embodiment for a cooling plate 110. The cooling plate is preferably made from a light-weight material that will conduct heat, although primary heat dissipation is provided by through the cooling channels 202. For example, the cooling plate 110 can be aluminum and/or other light-weight material. Combinations of metal and/or other materials can also be used to form the cooling plate 110. Further, the cooling plate includes one or more cooling channels 202 that are included within the cooling plate 110 and are open to the top surface 204. For the example embodiment depicted, one cooling channel 202 is formed within the top surface 204 for the cooling plate 110. One end of the cooling channel 202 is coupled to the port 126, which can receive cooling fluid 128, and the other end of the cooling channel 202 is coupled to the port 130, which can allow the cooling fluid 128 to exit. During operation, cooling fluid 128 is circulated within the cooling channel 202 to remove heat from the circuits and electronic components within the PA module. As also described above, one or more feed ports 116 can pass through the cooling plate 110 from its bottom surface 206 to its top surface 204 as well as through other layers as shown in FIG. 1.

To reduce the thickness of the cooling plate 110, no pipe connectors are required to be connected directly to the cooling channel 202. Further, the cooling channel 202 merges with ports 126/130, and the cooling channel 202 and ports 126/130 can be routed or positioned wherever is needed or optimal for the system to have external connections to the cooling fluid 128. External pipe connections can be made to the ports 126/130. Channel-to-pipe conversion can be built into the cooling plate 110, or separate components can be used for a sealing connection to the cooling plate 110. Other variations can also be implemented while still providing one or more cooling channels formed within the cooling plate 110. For example, the cooling channel 202 can be split into one or more additional channels within the cooling plate 110 and then recombined before exiting the cooling plate 110. For one example embodiment, the cooling channel 202 can be configured to split into two or more parallel channels within the cooling plate 110. Further, these multiple different cooling channels 202 can be configured and sized differently depending upon the circuit regions to be cooled. For example, different circuit regions may have different cooling requirements, and the different cooling channels 202 can be optimized for each of the circuit regions. Other variations can also be implemented.

Figure 2B:
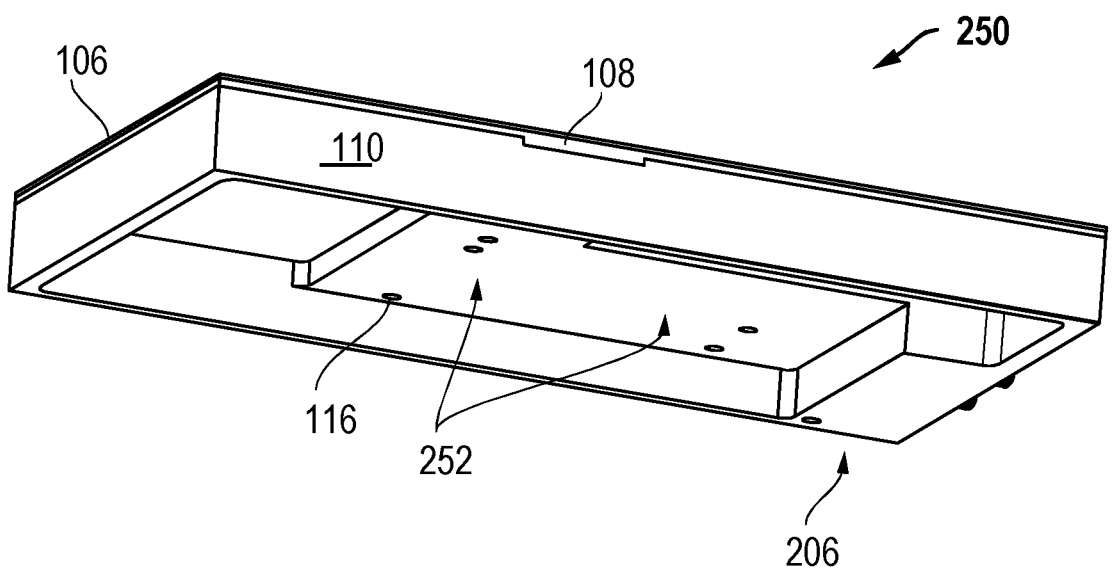
FIG. 2B is a bottom perspective view of an example embodiment for the cooling plate of FIG. 2A coupled to a ground plane and a circuit board.

For one embodiment to facilitate a compact and efficient implementation, the cooling plate 110 is laminated directly to the ground plane 108 as shown in FIG. 2B. This direct lamination reduces size requirements for the PA module 100 as it allows the cooling plate 110 to be thinner because the cooling channel 202 is open to the top surface of the cooling plate 110 before lamination. As such, heat transfer efficiency is improved by having cooling fluid 128 move within the cooling channel 202 directly against the ground plane 108 to dissipate heat from circuit components 104. This direct contact and cooling provides significant efficiency improvements by removing transitions in the heat transfer process. Further, the open configuration of the cooling channel 202 within the top surface 204 of the cooling plate 110 provides the option to mill fins 302 from the ground plane 108, as shown with respect to FIG. 3, to dramatically increase heat transfer. Excess material can also be removed from the ground plane 108 to reduce weight, although enough material should remain beneath the circuit components 104 to ensure a good ground connection.

For one embodiment, the ground plane 108 is bonded to the cooling plate 110. For another embodiment, the ground plane 108 is printed on the cooling plate 110 using a three-dimensional printing process, for example, using a three-dimensional printer. In additional embodiments, three-dimensional printing can be used to form the cooling plate 110 and/or other components. Further, the cooling plate 110 can extend beyond the ground plane 108, can be smaller than the ground plane 108, and can be positioned under only a portion of the ground plane 108. Still further, the ground plane 108 and the cooling plate 110 can be formed as a single integrated component, for example, using three-dimensional printing and/or other manufacturing techniques. Other variations can also be implemented while still taking advantage of the techniques described herein.

As indicated above, the ground plane 108 can be copper or other conductive material with good heat transfer properties, and the cooling plate 110 can be aluminum or other light-weight material. The direct-connection technique described herein allows the cooling plate 110 to be made of a less heat-conductive material, many of which are lighter in weight, because circuit components are cooled through the heat transfer from the ground plane 108 to the cooling fluid within the cooling channel 202. Although the cooling plate 110 can provide some heat dissipation, it can be configured such that it does not provide a significant cooling function for the PA module 100. For such reduced or non-cooling embodiments where nearly all heat transfer is directly in the cooling fluid, the cooling plate 110 can be made very light thereby reducing the weight of the PA module 100.

For one embodiment, the cooling channel 202 is coated with a protective material to remove or significantly reduce erosion and/or contamination of the cooling fluid 128 that could be caused by the cooling fluid 128 flowing through the cooling channel 202. For example, where water is used as the cooling fluid 128, this protective coating of the cooling channel 202 can protect the water from contamination as it travels through the cooling channel 202. Where the cooling channel 202 is aluminum, for example, this protective coating can help prevent aluminum from leaching into the water.

FIG. 2B is a bottom perspective view 250 of an example embodiment for the cooling plate 110. For this view 250, the ground plane 108 and the circuit board 106 are shown coupled to the cooling plate 110. The bottom surface 206 is visible in this view 250. As shown, there can be an area 252 recessed into the bottom surface 206 to allow for mounting of the electronics 112 as shown in FIG. 1. It is noted, however, that excess material from the cooling plate 110 can also be removed to reduce weight whether or not there are electronics 112 to house. Preferably, these electronics 112 are mounted to the bottom surface 206 below at least a portion of the cooling channel 202 shown in FIG. 2A. As such, heat transfer from the electronics 112 to the cooling fluid is facilitated to remove heat generated by components within the electronics 112. For this embodiment, the cooling plate 110 is preferably made of a material with reasonable heat transfer properties to allow heat to be dissipated from the electronics 112 through the cooling plate 110 to the cooling fluid 128 with the cooling channels 202.

Figure 5A:
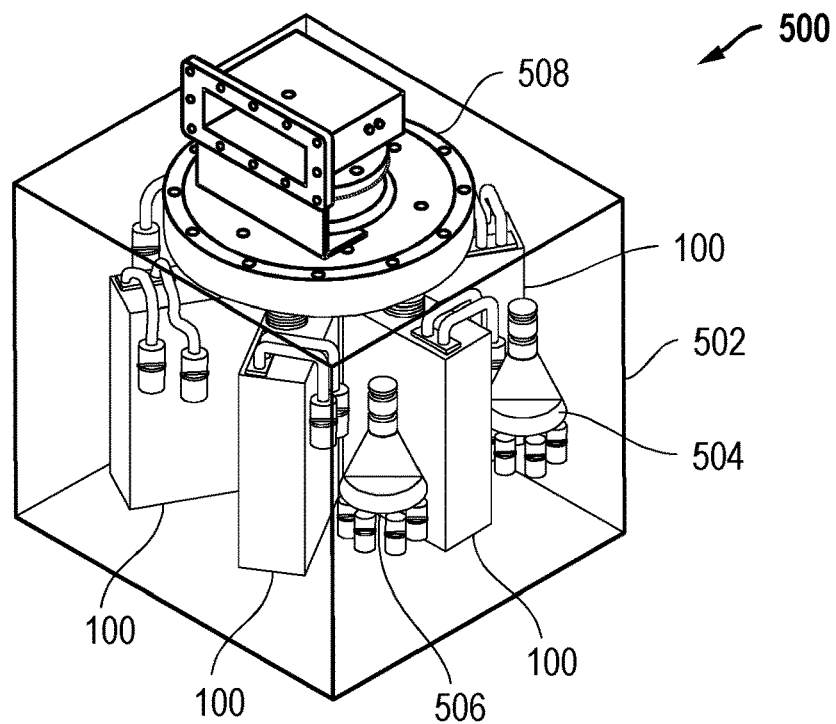
FIG. 5A is a perspective view of an example embodiment for a multi-stage power amplifier (PA) system including a plurality of PA modules as shown in FIG. 1.
Figure 5B:
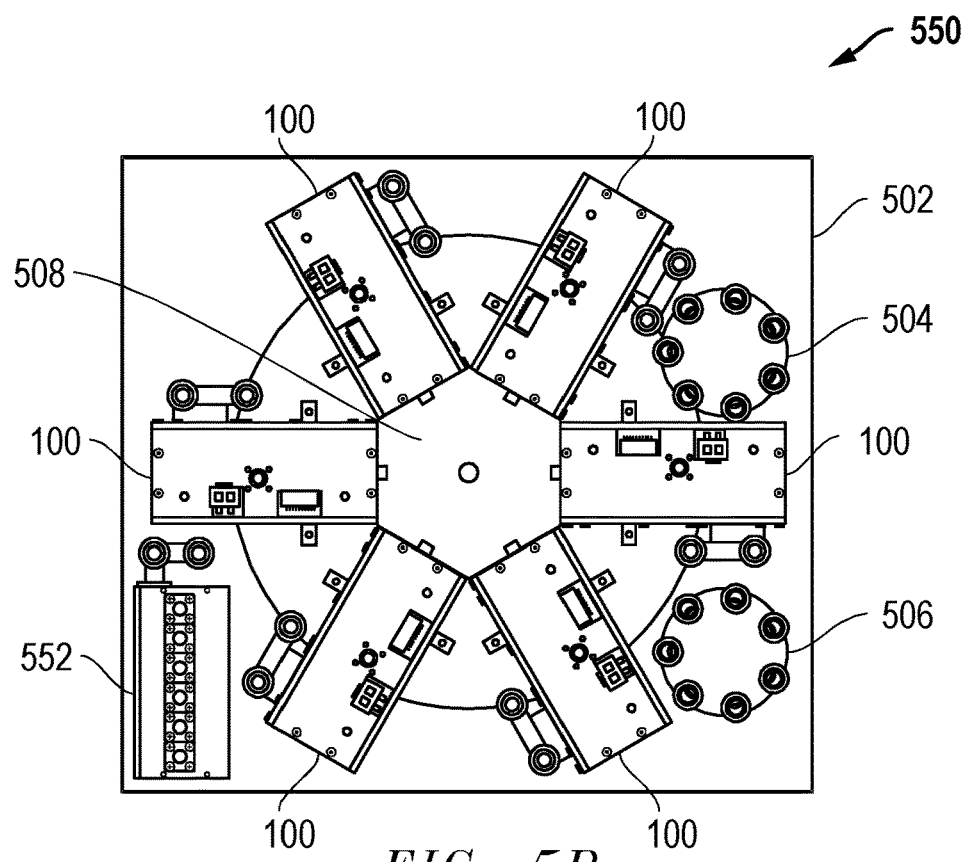
FIG. 5B is a bottom view for the multi-stage PA system of FIG. 5A.

As shown in FIG. 2B, excess material in the back of the cooling plate 110 is preferably removed to reduce weight and to provide a cavity or area 252 in which the electronics 112 can be mounted. RF bias voltages and power supply voltages can also be passed through the cooling plate 110 to the circuit components 104 through filtered feed ports 116. For one embodiment, the electronics 112 include RF bias circuitry, power transistor bias voltages, DC-to-DC power conversion circuitry, and/or other circuitry. The power conversion circuitry, for example, can provide DC-to-DC power conversion to fifty (50) volts for high power operation. As indicated above, cooling for this RF bias circuitry and power conversion circuitry can be facilitated by locating the electronics 112 at least in part under the cooling channel 202, although some or all of the electronics 112 can be positioned in other locations depending upon heat dissipation requirements. The electronics 112 can also include one or more sensors that measure parameters associated with the operation of the PA module 100 including the circuit components 104 shown in FIG. 1. As such, the electronics 112 can provide safety monitoring, such as with a controller coupled to temperature sensors located near the power transistors within the circuit components 104, humidity sensors on the back of the cooling plate 110, and/or other sensors. For example, self-contained safety monitors can be provided that will shut down the module in case of failure without input from an external computer or microprocessor. Although self-contained operation can be implemented, data associated with these monitors can also be communicated through a data cable for external processing or analysis. It is also noted that the electronics 112 can be implemented using a printed circuit board (PCB), such as circuit board 114. As shown in FIG. 1, the circuit board 114 can be positioned under the cooling plate 110 within the housing 102 to allow for reductions in size and weight of the PA module 100 and thereby reduce the size of multi-stage implementations as shown in FIGS. 5A-5B. In contrast, circuits for prior solutions generally required their own modules and were often positioned external to PA circuit modules.

Figure 3:
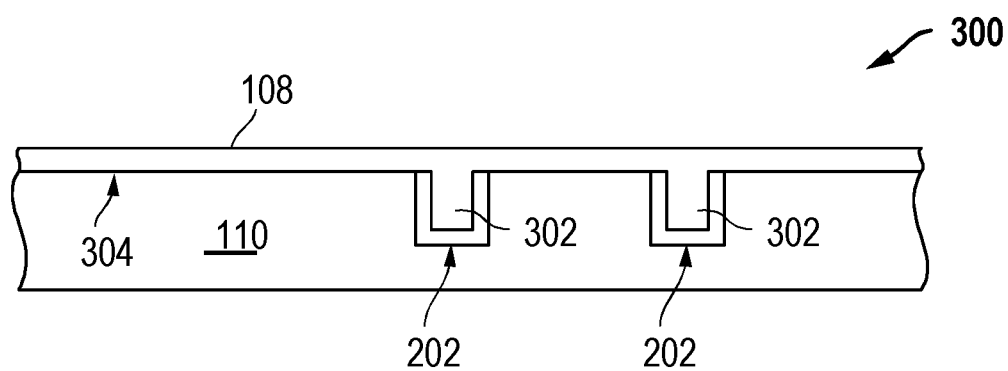
FIG. 3 is a cross-section view for an example embodiment where fins are formed within the ground plane and positioned within the cooling channels to facilitate heat dissipation.

FIG. 3 is a cross-section view 300 for an example embodiment where fins 302 are formed within the ground plane 108 to facilitate heat dissipation. The fins 302 are formed in the bottom surface 304 of the ground plane 108 and are configured to fit within the cooling channel 202 for the cooling plate 110. For example, if the cooling channel 202 shown in FIG. 2A is used, the fins 302 can be implemented as structures that extend from the bottom surface 304 of the ground plane 108 and that are configured to fit within the cooling channel 202. Although the fins 302 are preferably non-continuous structures for improved heat transfer, the fins 302 can also be a continuous structure. Further, the fins 302 can be continuous or non-continuous depending upon the geometry selected for the cooling channel 202. Fin variations can also be implemented depending upon the designs implemented for the number and layout for the cooling channels 202 within the cooling plate 110. For example, fins 302 could alternatively be formed in the cooling plate 110 such that they extend upward into the cooling channels 202. In addition, fin structures could be formed both as fins in the ground plane 108 that extend down into the cooling channel 202 and as fins in the cooling plate 110 that extend up into the cooling channel 202. It is also noted that the fins 302 can be plated or coated with additional materials and/or metals. For example, gold plating can be provided to facilitate heat transfer. Other variations can also be implemented for the fins 302 positioned within the cooling channels 202.

Figure 4:
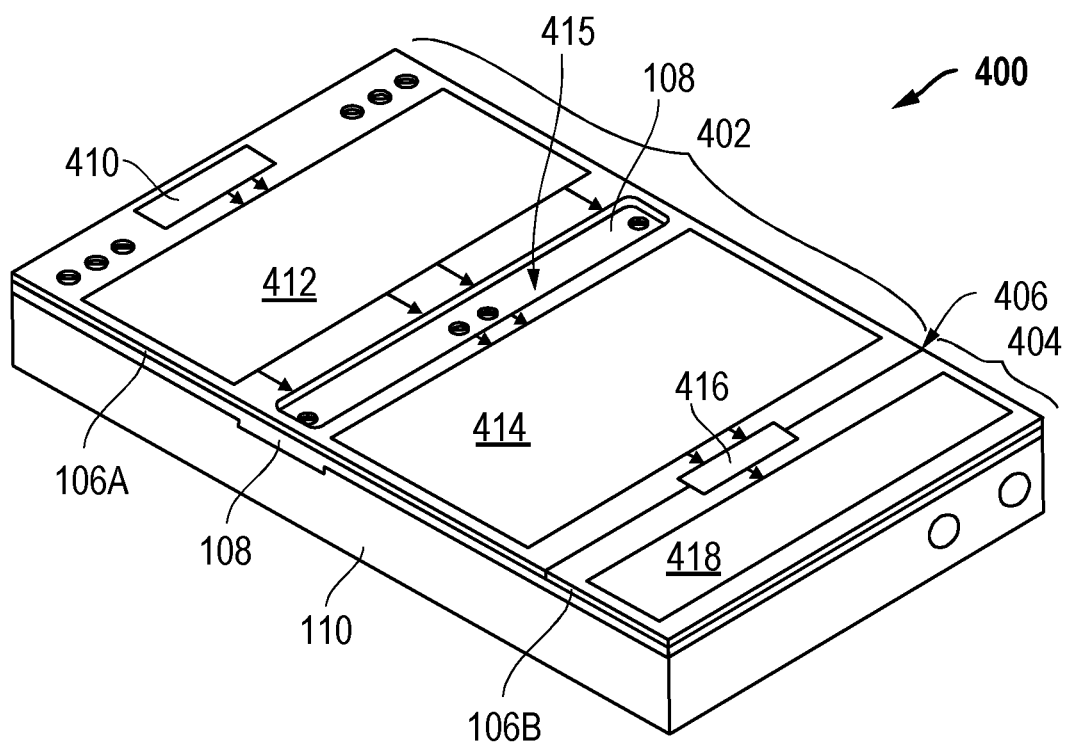
FIG. 4 is a top perspective view of an example embodiment where split dielectric regions are used to implement the circuit board for radio frequency (RF) circuits.

FIG. 4 is a top perspective view 400 of an example embodiment where split dielectric regions 402/404 and related connections and traces for multiple circuit boards 106A/106B are used to implement the circuit board 106 shown in FIG. 1. For one embodiment as shown, two circuit boards 106A and 106B are used to implement the split dielectric regions 402 and 404. The circuit boards 106A/106B are coupled to the ground plane 108, and the ground plane 108 is coupled to the cooling plate 110. For example embodiment 400, circuit components 104 shown in FIG. 1 have been removed from the circuit boards 106A/106B, and circuit regions 410, 412, 414, 416, and 418 are shown. In addition, the underlying ground plane 108 is exposed in circuit region 415, which provides a trench, for example, to mount power amplifier transistors. For one embodiment, RF input circuitry and an RF splitter will be included in circuit region 410. For one embodiment, the RF splitter is a quadrature splitter that generates two RF signals that are ninety degrees out of phase with respect to each other. Two RF paths are then provided to RF matching circuitry included in circuit region 412. Power amplifiers, such as transistor power amplifiers, are included in circuit region 415. Additional RF matching circuitry is included in circuit region 414. An RF combiner is included in circuit region 416 to combine the RF signal paths. For one embodiment, the RF combiner is a quadrature combiner that re-aligns and combines the out-of-phase RF signal paths. RF output circuitry is included in circuit region 418 to output an RF signal.

It is noted that power amplifier transistors mounted in circuit region 415 can be transistor integrated circuits, such as gallium nitride (GaN) transistor integrated circuits. For further embodiments, the ground plane 108 and the ground substrate for the transistor integrated circuits can be implemented as the same or common component. This configuration reduces or minimizes the layers between the transistor integrated circuits and the cooling fluid within the cooling channels 202. Direct fluid contact between the cooling fluid and the ground plane 108, which also serves as the ground substrate for the transistor integrated circuit, allows for more rapid dissipation of heat generated by the power amplifier transistors within the transistor integrated circuits.

During operation, it is expected that a first dielectric region 402 with respect to circuit board 106A will have RF signal paths at lower power levels than those within a second dielectric region 404 for the circuit board 106B. For example, an RF combiner included in circuit region 416 can be mounted along a boundary 406 between the two circuit boards 106A/106B. As such, lower power operation occurs in the first dielectric region 402 and higher power operation occurs in the second dielectric region 404.

For one embodiment, multiple different dielectric materials are used to form the circuit boards 106A/106B. For example, circuit board 106A and can be formed using a first dielectric material or combination of dielectric materials, and the circuit board 106B can be formed using a second dielectric material or combination of dielectric materials. The circuit boards 106A/106B are then laminated or otherwise coupled to the copper ground plane 108. For one embodiment, an RF splitter in circuit region 410 splits an RF input signal into multiple RF signals, and these RF signals are amplified using power transistors in circuit region 415. The amplified RF signals are then combined into a single RF output signal using an RF combiner that straddles boundary 406 in circuit region 416.

It is noted that the use of different dielectric materials is often preferable to a single material due to different target operating parameters for different RF circuitry included in the different circuit regions 410, 412, 414, 415, 416, and 418. For example, higher power operation in circuit region 418 may be easier to achieve without failures in a second dielectric material. As shown in FIG. 4, therefore, the dielectric material used to form the circuit board 106A within the second dielectric region 402 can be different in form or material from the dielectric material used to form the circuit board 106B in the first dielectric region 404. For example, the dielectric material in the second dielectric region 404 can be thicker than the dielectric material in the first dielectric region 402. Further as indicated above, the dielectric material in the second dielectric region 404 can be a different material capable of withstanding much higher power without causing failures such as shorts to the ground plane 108. The dielectric material in the first dielectric region 402 can be a material having lower power ratings and/or selected to achieve target operating parameters for the circuitry within the first dielectric region 402. For example, matching circuits or other components within circuit regions 410, 412, 414, 415, and 416 may require a different dielectric that will not support a highest power RF signal path in circuit region 418. In addition, although two dielectric regions 402/404 are shown in FIG. 4, it is further noted that additional dielectric regions could also be used.

FIG. 5A is a perspective view 500 of an example embodiment for a multi-stage power amplifier (PA) system including a plurality of PA modules 100. For the embodiment shown, six (6) PA modules 100 are included within the multi-stage PA system. A seventh PA module 100 can be used as a pre-amplifier 552 that feeds the other PA modules 100, as shown in FIG. 5B. A combiner 508, such as a radial combiner or a planar combiner, receives the RF output signals of the PA modules 100 and outputs a combined RF signal. The combined RF output signal is a higher-power RF output signal that can then be used by a processing system, such as a plasma processing system. It is noted that the combiner 508 could also be removed for some implementations. For one embodiment, each of the PA modules 100 generates an RF output signal from 0 W to greater than or equal to 600 W, and the multi-stage PA system provides a combined RF output signal from 0 W to greater than or equal to 3600 watts. To provide cooling fluid for the PA modules 100, the PA system enclosure 502 also includes a cooling fluid input manifold 504 and a cooling fluid output manifold 506. The input manifold 504 receives the cooling fluid through an input tube and includes an output tube coupled to each PA module 100. Although not shown, it is understood that these output tubes are connected to the cooling channels 202 for the PA modules 100. The output manifold 506 includes an input tube for each PA module 100 and outputs the cooling fluid through a return tube. Although not shown, it is understood that these input tubes are connected to cooling channels for the PA modules 100. An external cooling fluid delivery system (not shown) can be coupled to the input manifold 504 and the output manifold 506 to control the flow of cooling fluid through the PA modules 100. Due to the efficient heat dissipation provided by the cooling channels 202, as described above, the flow rate for the cooling fluid can be reduced as compared to prior solutions.

FIG. 5B is a bottom view 550 for the multi-stage PA system of FIG. 5A. The radial combiner 508 is positioned within the middle of the multi-stage PA enclosure 502 and receives an RF output signal from each of the PA modules 100. For the example embodiment depicted, six (6) PA modules 100 are included. For the embodiment depicted, a pre-amplifier 552 is also included within the enclosure 502 for the multi-stage PA system. A seventh PA module 100 can be used to implement the pre-amplifier 552 and can be configured to output an RF output signal at a lower power level such as 300 W. During operation, the pre-amplifier 552 receives an RF input signal and feeds an amplified RF input signal to each of the PA modules 100. For example, an RF splitter is coupled to the output of the pre-amplifier 552 to supply the amplified RF input signal to each of the different PA modules 100. The input manifold 504 for the cooling fluid is positioned within a gap region between two of the PA modules 100. The output manifold 506 for the cooling fluid is positioned within a different gap region between two of the PA modules 100. The input manifold 504 and the output manifold 506 can be coupled to the PA modules 100 and the pre-amplifier 552, which can be a seventh PA module 100, to circulate cooling fluid within the PA modules 100. It is noted that this placement of the circular input manifold 504 and circular output manifold 506 reduces the overall size of the multi-state PA system as additional space is not required on the sides or other locations. The circular design for the manifolds 504/506 is unique and allows the removal of flow valves and flow meters typically required in prior solutions to balance water flow to the PA modules, which are preferably kept at even temperatures.

It is further noted that the techniques described herein may be utilized with a wide range of plasma processing systems. For example, the techniques may be utilized with plasma etch process systems, plasma deposition process systems or any other plasma process system.

Figure 6:
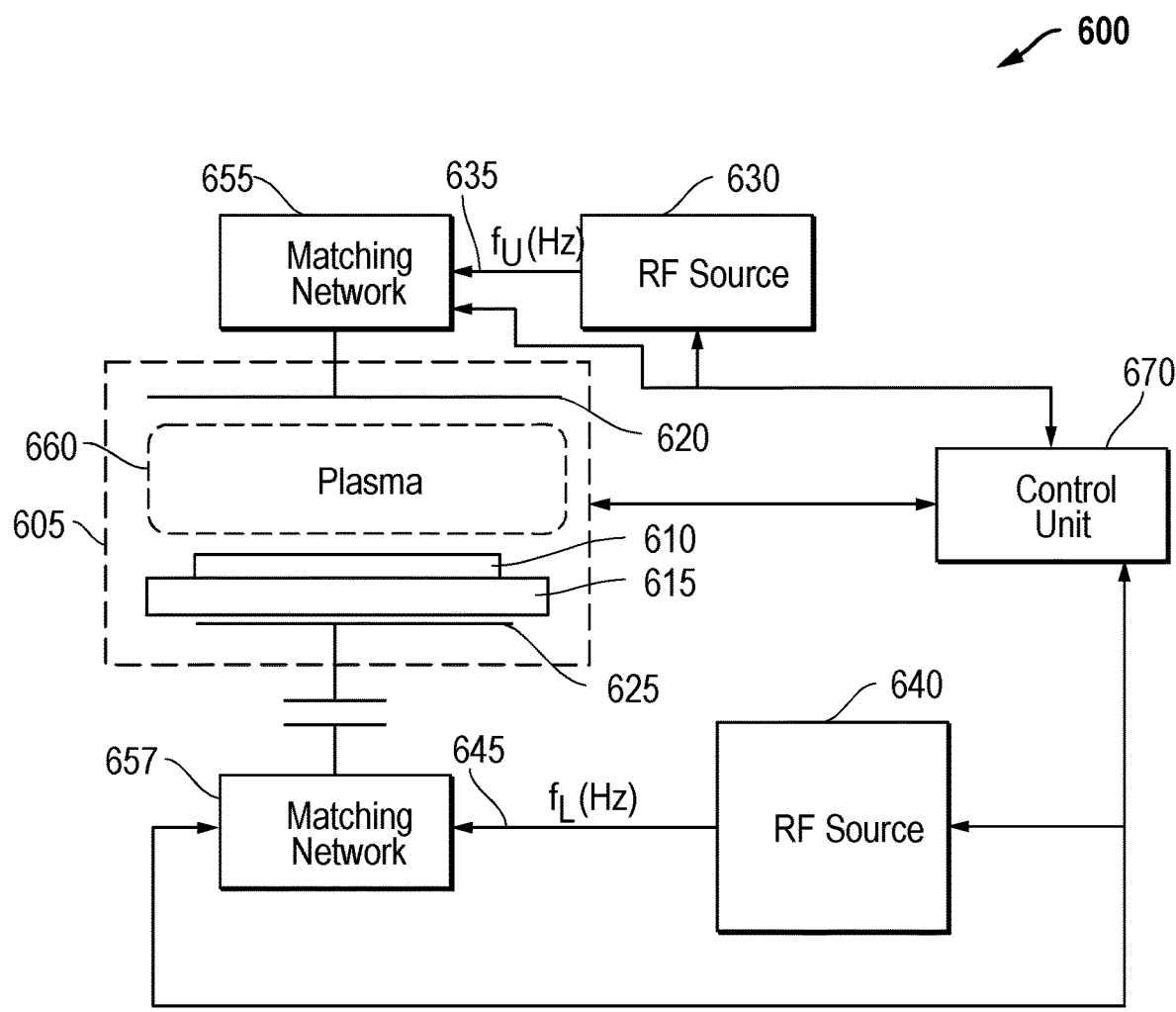
FIG. 6 provides one example embodiment for a plasma processing system that can be used with respect to the disclosed techniques and is provided only for illustrative purposes.

FIG. 6 provides one example embodiment for a plasma processing system 600 that can be used with respect to the disclosed techniques and is provided only for illustrative purposes. The plasma processing system 600 may be a capacitively coupled plasma processing apparatus, inductively coupled plasma processing apparatus, microwave plasma processing apparatus, radial line slot antenna (RLSA™) microwave plasma processing apparatus, electron cyclotron resonance (ECR) plasma processing apparatus, or other type of processing system or combination of systems. Thus, it will be recognized by those skilled in the art that the techniques described herein may be utilized with any of a wide variety of plasma processing systems. The plasma processing system 600 can be used for a wide variety of operations including, but not limited to, etching, deposition, cleaning, plasma polymerization, plasma-enhanced chemical vapor deposition (PECVD), atomic layer deposition (ALD) and so forth. The structure of a plasma processing system 600 is well known, and the particular structure provided herein is merely of illustrative purposes. It will be recognized that different and/or additional plasma process systems may be implemented while still taking advantage of the techniques described herein.

Looking in more detail to FIG. 6, the plasma processing system 600 may include a process chamber 605. As is known in the art, process chamber 605 may be a pressure controlled chamber. A substrate 610 (in one example a semiconductor wafer) may be held on a stage or chuck 615. An upper electrode 620 and a lower electrode 625 may be provided as shown. The upper electrode 620 may be electrically coupled to an upper RF source 630 through an upper matching network 655. The upper RF source 630 may provide an upper frequency voltage 635 at an upper frequency ($f_U$). The lower electrode 625 may be electrically coupled to a lower RF source 640 through a lower matching network 657. The lower RF source 640 may provide a lower frequency voltage 645 at a lower frequency ($f_L$). Though not shown, it will be known by those skilled in the art that a voltage may also be applied to the chuck 615.

Components of the plasma processing system 600 can be connected to, and controlled by, a control unit 670 that in turn can be connected to a corresponding memory storage unit and user interface (all not shown). Various plasma processing operations can be executed via the user interface, and various plasma processing recipes and operations can be stored in a storage unit. Accordingly, a given substrate can be processed within the plasma processing chamber with various microfabrication techniques. It will be recognized that since control unit 670 may be coupled to various components of the plasma processing system 600 to receive inputs from and provide outputs to the components.

The control unit 670 can be implemented in a wide variety of manners. For example, the control unit 670 may be a computer. In another example, the control unit may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality of a proscribed plasma process recipe. It is further noted that the software or other programming instructions can be stored in one or more non-transitory computer-readable mediums (e.g., memory storage devices, FLASH memory, DRAM memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

In operation, the plasma processing apparatus uses the upper and lower electrodes to generate a plasma 660 in the process chamber 605 when applying power to the system from the upper RF source 630 and the lower RF source 640. Further, as is known in the art, ions generated in the plasma 660 may be attracted to the substrate 610. The generated plasma can be used for processing a target substrate (such as substrate 610 or any material to be processed) in various types of treatments such as, but not limited to, plasma etching, chemical vapor deposition, treatment of semiconductor material, glass material and large panels such as thin-film solar cells, other photovoltaic cells, organic/inorganic plates for flat panel displays, and/or other applications, devices, or systems.

Application of power results in a high-frequency electric field being generated between the upper electrode 620 and the lower electrode 625. Processing gas delivered to process chamber 605 can then be dissociated and converted into a plasma. As shown in FIG. 6, the exemplary system described utilizes both upper and lower RF sources. It will be recognized that the techniques described herein may be utilized with in a variety of other plasma systems. In one example system, the sources may switched (higher frequencies at the lower electrode and lower frequencies at the upper electrode). Further, a dual source system is shown merely as an example system and it will be recognized that the techniques described herein may be utilized with other systems in which a frequency power source is only provided to one electrode, direct current (DC) bias sources are utilized, or other system components are utilized.

It is noted that one or more deposition processes can be used to form the material layers described herein. For example, one or more depositions can be implemented using chemical vapor deposition (CVD), plasma enhanced CVD (PECVD), physical vapor deposition (PVD), atomic layer deposition (ALD), and/or other deposition processes. For a plasma deposition process, a precursor gas mixture can be used including but not limited to hydrocarbons, fluorocarbons, or nitrogen containing hydrocarbons in combination with one or more dilution gases (e.g., argon, nitrogen, etc.) at a variety of pressure, power, flow and temperature conditions. Lithography processes with respect to photoresist (PR) layers can be implemented using optical lithography, extreme ultra-violet (EUV) lithography, and/or other lithography processes. The etch processes can be implemented using plasma etch processes, discharge etch processes, and/or other desired etch processes. For example, plasma etch processes can be implemented using plasma containing fluorocarbons, oxygen, nitrogen, hydrogen, argon, and/or other gases. In addition, operating variables for process steps can be controlled to ensure that CD (critical dimension) target parameters for vias are achieved during via formation. The operating variables may include, for example, the chamber temperature, chamber pressure, flowrates of gases, frequency and/or power applied to electrode assembly in the generation of plasma, and/or other operating variables for the processing steps. Variations can also be implemented while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate including a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A power amplifier module, comprising:
   a circuit board;
   radio frequency (RF) circuit components coupled to the circuit board and having an RF input signal and an amplified RF output signal;
   a ground plane coupled to the circuit board; and
   a cooling plate coupled to the ground plane and having one or more cooling channels configured to receive a cooling fluid, the one or more cooling channels being open to a top surface of the cooling plate, wherein the one or more cooling channels are positioned to dissipate heat from one or more of the RF circuit components through the ground plane, and wherein the ground plane and the cooling plate are part of an integrated component.

2. The power amplifier module of claim 1, wherein a maximum power level for the amplified RF output signal is greater than or equal to 300 watts, and wherein the power amplifier module is configured to operate at frequencies between 400 kilohertz (kHz) to 101 megahertz (MHz), in a frequency band from 800 MHz to 900 MHz, or at frequencies greater than or equal to 2 gigahertz (GHz).

3. The power amplifier module of claim 1, wherein the RF circuit components have multiple amplified RF output signals.

4. The power amplifier module of claim 1, further comprising one or more fins positioned within the one or more cooling channels to facilitate heat dissipation.

5. The power amplifier module of claim 4, wherein the fins extend from the ground plane or the cooling plate.

6. The power amplifier module of claim 1, wherein the ground plane and the cooling plate are formed as the integrated component using a three-dimensional printing process.

7. The power amplifier module of claim 1, wherein the circuit board comprises two or more regions made from different dielectric materials.

8. The power amplifier module of claim 7, wherein an RF combiner is coupled at a boundary between at least two of the regions.

9. The power amplifier module of claim 1, wherein the ground plane comprises copper, and wherein the cooling plate comprises aluminum.

10. The power amplifier module of claim 1, further comprising electronics coupled to a bottom surface of the cooling plate, and wherein the electronics comprise at least one of power conversion circuitry or RF bias circuitry.

11. The power amplifier module of claim 10, wherein the cooling plate and the ground plane shield the electronics from interference without additional RF shielding components.

12. The power amplifier module of claim 10, further comprising one or more filtered feed ports passing through the ground plane and the cooling plate and coupled between the electronics and the RF circuit components.

13. The power amplifier module of claim 1, wherein the ground plane, the RF circuit components, and the cooling plate are mounted within a housing, and a volume for the housing is less than or equal to fifty cubic inches, and wherein a weight for the power amplifier module is less than or equal to three pounds.

14. A multi-stage power amplifier system, comprising:
a plurality of power amplifier (PA) modules; and
a combiner coupled to receive radio frequency (RF) output signals from the PA modules and to output a combined RF output signal;
wherein each of the plurality of PA modules comprises:
a circuit board;
radio frequency (RF) circuit components coupled to the circuit board and having an RF input signal and an amplified RF output signal;
a ground plane coupled to the circuit board; and
a cooling plate coupled to the ground plane and having one or more cooling channels configured to receive a cooling fluid, the one or more cooling channels being open to a top surface of the cooling plate;
an input manifold for a fluid input; and
an output manifold for fluid output, the input manifold and the output manifold being coupled to the one or more cooling channels for the plurality of PA modules, the input manifold and the output manifold being positioned within gap regions between the PA modules, wherein the one or more cooling channels are positioned to dissipate heat from one or more of the RF circuit components through the ground plane.

15. The multi-stage power amplifier system of claim 14, further comprising an enclosure for the multi-stage PA amplifier system enclosing the input manifold and the output manifold, and wherein the input manifold and the output manifold are circular.

16. The multi-stage power amplifier system of claim 15, further comprising a pre-amplifier positioned within the enclosure and coupled to the plurality of PA modules, the input manifold, and the output manifold.

17. The multi-stage power amplifier system of claim 14, further comprising electronics coupled to a bottom surface of the cooling plate, and wherein the electronics comprise at least one of power conversion circuitry or RF bias circuitry.

18. The multi-stage power amplifier system of claim 14, wherein each of the PA modules has a weight less than or equal to three pounds and comprises a housing that holds the ground plane, the RF circuits components, and the cooling plate, and wherein the housing has a volume of less than or equal to fifty cubic inches.

19. A method to dissipate heat within a power amplifier module, comprising:
receiving an radio frequency (RF) input signal with RF circuit components coupled to a circuit board that is coupled to a ground plane;
amplifying the RF input signal to output an amplified RF output signal;
flowing a cooling fluid through one or more cooling channels within a cooling plate coupled to the ground plane to dissipate heat from one or more of the RF circuit components through the ground plane, the one or more cooling channels being open to a top surface of the cooling plate; and
shielding electronics coupled to a bottom surface of the cooling plate from RF interference using the ground plane and the cooling plate, wherein the electronics comprise at least one of power conversion circuitry or RF bias circuitry.

20. The method of claim 19, wherein a maximum power level for the amplified RF output signal is greater than or equal to 300 watts, and wherein the power amplifier module is configured to operate at frequencies between 400 kilohertz (kHz) to 101 megahertz (MHz), in a frequency band from 800 MHz to 900 MHz, or at frequencies greater than or equal to 2 gigahertz (GHz).

21. The method of claim 19, the flowing of the cooling fluid also dissipates heat from electronics coupled to a bottom surface of the cooling plate.

22. The method of claim 19, further comprising passing signals from electronics coupled to a bottom surface of the cooling plate to the RF circuit components through one or more filtered feed ports.

23. The method of claim 19, further comprising receiving the cooling fluid from an input manifold and providing the cooling fluid to an output manifold after passing through the one or more cooling channels, wherein the input manifold and the output manifold are coupled a plurality of additional power amplifier modules within an enclosure for a multi-stage power amplifier system.

24. A power amplifier module comprising:
a housing;
a first circuit board disposed in the housing;
radio frequency (RF) circuit components attached to the first circuit board and having an RF input signal and an amplified RF output signal;
a ground plane comprising a first side and a second side, the first side being attached to the first circuit board;
a cooling plate comprising a first side and a second side, the first side of the cooling plate contacting the second side of the ground plane and having one or more cooling channels configured to receive a cooling fluid, the one or more cooling channels being open to a top surface of the cooling plate, the second side of the ground plane sealing the cooling fluid within the one or more cooling channels, wherein the one or more cooling channels are positioned to dissipate heat from one or more of the RF circuit components through the ground plane;

a second circuit board disposed in the housing; and electronics circuitry comprising a DC-to-DC power conversion circuitry disposed in the housing, the electronics circuitry having a first surface attached to the second circuit board, the electronics circuitry having a second surface attached to the second side of the cooling plate.

* * * * *